(12) United States Patent
Cok

(10) Patent No.: US 7,722,422 B2
(45) Date of Patent: *May 25, 2010

(54) DEVICE AND METHOD FOR IMPROVED POWER DISTRIBUTION FOR A TRANSPARENT ELECTRODE

(75) Inventor: Ronald S. Cok, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 378 days.

This patent is subject to a terminal disclaimer.

(21) Appl. No.: 11/751,064

(22) Filed: May 21, 2007

(65) Prior Publication Data

US 2008/0290787 A1 Nov. 27, 2008

(51) Int. Cl.
*H01J 9/20* (2006.01)
*H01J 1/54* (2006.01)
(52) U.S. Cl. .................. 445/23; 313/498; 313/504; 445/24
(58) Field of Classification Search ................. 313/483, 313/498–504; 257/13, 79; 445/23, 24
See application file for complete search history.

(56) References Cited

U.S. PATENT DOCUMENTS

| 6,645,444 | B2 * | 11/2003 | Goldstein | 423/1 |
| 6,812,637 | B2 | 11/2004 | Cok et al. | |
| 7,432,187 | B1 * | 10/2008 | Cok | 438/609 |
| 2003/0085403 | A1 * | 5/2003 | Nagayama et al. | 257/72 |
| 2006/0003262 | A1 | 1/2006 | Yang et al. | |
| 2006/0057502 | A1 * | 3/2006 | Okada et al. | 430/313 |
| 2007/0013291 | A1 * | 1/2007 | Cok et al. | 313/501 |

FOREIGN PATENT DOCUMENTS

| WO | 01/82390 | 11/2001 |
| WO | 03/090260 | 10/2003 |

OTHER PUBLICATIONS

U.S. Appl. No. 11/179,186, filed Jul. 12, 2005, Cok.
U.S. Appl. No. 11/253,909, filed Oct. 18, 2005, Cok.

* cited by examiner

*Primary Examiner*—Bumsuk Won
*Assistant Examiner*—Nathaniel J Lee
(74) *Attorney, Agent, or Firm*—Morgan Lewis & Bockius LLP

(57) ABSTRACT

A method for improving power distribution of a transparent electrode that includes forming an LED over a substrate; the LED including a first electrode, a transparent electrode, and one or more light-emissive layers formed there-between. A patterned protective layer is formed on the transparent electrode; the patterned protective layer having open areas wherein the protective layer is not present, and covered areas wherein the protective layer is present. A solution having curable conductive precursor components is deposited over the open areas onto the transparent electrode. The precursor components of the solution are pattern-wise cured to form patterned electrically conductive areas on the transparent electrode in the open areas, and any uncured precursor components of the solution are removed.

20 Claims, 9 Drawing Sheets

DEVICE AND METHOD FOR IMPROVED POWER DISTRIBUTION FOR A TRANSPARENT ELECTRODE

FIELD OF THE INVENTION

The present invention relates to top-emitting light-emitting diode (LED) devices, and more particularly, to a method for improving power distribution in a transparent electrode.

BACKGROUND OF THE INVENTION

Light-emitting diodes (LEDs) are a promising technology for flat-panel displays and area illumination lamps and backlights. Applications of LED devices include active-matrix image displays, passive-matrix image displays, and area-lighting devices such as, for example, selective desktop lighting. Irrespective of the particular LED device configuration tailored to these broad fields of applications, all LEDs function on the same general principles. An electroluminescent (EL) medium structure is sandwiched between two electrodes. At least one of the electrodes is at least partially light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the LED is said to be forward-biased. Positive charge carriers (holes) are injected from the anode into the EL medium structure, and negative charge carriers (electrons) are injected from the cathode. Such charge-carrier injection causes current flow from the electrodes through the EL medium structure. Recombination of holes and electrons within a zone of the EL medium structure results in emission of light from this zone that is, appropriately, called the light-emitting zone or interface. The EL medium structure can be formed of a stack of sublayers that can include small molecule organic layers, polymer layers, or inorganic layers. Additional charge-control layers, for example hole-injection, electron-injection, hole-blocking, electron-blocking, hole-transport, electron-transport, and contact layers are known and may be employed for both organic and inorganic applications. Such layers and sublayers are known and understood by those skilled in the LED art.

Full-color LED devices may employ a variety of materials to emit different colors of light. In this arrangement, the LED device is patterned with different sets of materials, each set of materials associated with a particular color of light emitted. Each pixel in an active-matrix, full-color LED device typically employs each set of materials, for example to form a red, green, and blue sub-pixel. In an alternative arrangement, a single set of materials emitting broadband light may be deposited in continuous layers with arrays of differently colored filters employed to create a full-color LED device. In addition, black-matrix materials may be employed between the color filters in non-emissive areas of the LED device to absorb ambient light and thereby improve the contrast of the LED device. Such color filter and black-matrix materials are known in the art and are employed, for example, in the LCD industry. The contrast improvement possible by providing a black-matrix material between light-emitting areas of the LED device is limited by the relative size of the light-emitting areas and the areas between the light-emitting areas, i.e. the fill factor of the LED device.

The emitted light is directed towards an observer, or towards an object to be illuminated, through the light-transmissive electrode. If the light-transmissive electrode is between the substrate and the light-emissive elements of the LED device, the device is called a bottom-emitting LED device. Conversely, if the light-transmissive electrode is not between the substrate and the light-emissive elements, the device is referred to as a top-emitting LED device. The present invention is primarily directed to a top-emitting LED device.

In top-emitting LED devices, light is emitted through an upper electrode or top electrode, typically but not necessarily the cathode, which has to be sufficiently light transmissive, while the lower electrode(s) or bottom electrode(s), typically but not necessarily the anode, can be made of relatively thick and electrically conductive metal compositions which can be optically opaque. Because light is emitted through an electrode, it is important that the electrode through which light is emitted be sufficiently light transmissive to avoid absorbing the emitted light. Typical prior-art materials proposed for such electrodes include indium tin oxide (ITO) and very thin layers of metal, for example silver or aluminum or metal alloys including silver or aluminum. However, the current-carrying capacity of such electrodes is limited, thereby limiting the amount of power that can be supplied to the LED materials, and hence the amount of light that can be emitted from the light-emissive layers.

Referring to FIG. 11, a top-emitting LED device as suggested by the prior art is illustrated having a substrate 10 (reflective, transparent, or opaque). Over the substrate 10, a semiconducting layer is formed providing thin-film electronic components 30 for driving an LED. An interlayer insulating and planarizing layer 32 is formed over the thin-film electronic components 30 and a patterned reflective electrode 12 defining LED light-emissive elements is formed over the insulating layer 32. An inter-pixel insulating film 34 separates the elements of the patterned reflective electrode 12. One or more first layers 14 of light-emissive materials and any desired charge-control materials, are formed over the patterned reflective electrode 12. A transparent second electrode 16 is formed over the one or more first layers 14 of organic material to form an LED 11. A gap 19 separates the transparent second electrode 16 from an encapsulating cover 20. The encapsulating cover 20 is transparent and may be coated directly over the transparent electrode 16 so that no gap 19 exists. In some prior-art embodiments, the transparent electrode 12 may instead be at least partially transparent and/or light absorbing. Because suitable transparent conductors, for example ITO, have a limited conductivity, the current that may be passed through the organic layers 14 is limited and the uniformity of the light-emitting areas in an OLED device may be adversely affected by differences in current passed through various portions of the transparent conductor 16.

As taught in issued patent U.S. Pat. No. 6,812,637 entitled "OLED Display with Auxiliary Electrode", issued Nov. 2, 2004 by Cok, an auxiliary electrode 70 may be provided between the light-emitting areas 24 of the LED to improve the conductivity of the transparent electrode 16 and enhance the current distribution to the LED. For example, a thick, patterned layer of aluminum or silver or other metals or metal alloys may be employed. However, the formation of the auxiliary electrode 70 is problematic. Sputtering through a shadow mask is difficult for large substrates due to thermal expansion and alignment problems of the shadow mask. Likewise, evaporative deposition of conductive materials such as metals requires high temperatures and suffers from the same mask problems. High temperatures may also destroy any temperature-sensitive underlying layers. The use of photolithography to pattern an auxiliary electrode may compromise the integrity of underlying layers, particularly for organic devices.

Co-pending, commonly assigned U.S. Ser. No. 11/179, 186, filed Jul. 12, 2006, describes an organic light-emitting diode (OLED) device having an auxiliary electrode grid located above a transparent second electrode, providing spacing between the transparent second electrode and a cover. Co-pending, commonly assigned U.S. Ser. No. 11/253,909 filed Oct. 18, 2005, describes an organic light-emitting diode (OLED) device having an electrode with reflective and transparent portions in the light emissive area, the transparent portion being a relatively lower electrically conductive portion so that light emitted by the light-emitting organic layer passes through the transparent portion and the reflective portion being a relatively higher electrically conductive portion for reflecting emitted light. However, these disclosures do not address the robustness of any manufacturing process required to form patterned conductors in electrical contact with a transparent electrode and may suffer from the problems cited above. These disclosures are incorporated in their entirety by reference.

It is known in the prior art to form conductive traces using nanoparticles comprising, for example silver. The synthesis of such metallic nano-crystals is known. For example, U.S. Pat. No. 6,645,444 entitled "Metal nanocrystals and synthesis thereof", issued Nov. 11, 2003 by Goldstein, describes a process for forming metal nanocrystals that involves complexing a metal ion and an organic ligand in a solvent and introducing a reducing agent to reduce a plurality of metal ions to form the metal nanocrystals associated with the organic ligand. The nanocrystals are optionally doped or alloyed with other metals.

US2006/0073667 entitled, "Stabilized silver nanoparticles and their use" published Apr. 6, 2006 by Li et al., describes a process comprising: reacting a silver compound with a reducing agent comprising a hydrazine compound in the presence of a thermally removable stabilizer in a reaction mixture comprising the silver compound, the reducing agent, the stabilizer, and an optional solvent, to form a plurality of silver-containing nanoparticles with molecules of the stabilizer on the surface of the silver-containing nanoparticles. The composition may be heated to form an electrically conductive layer comprising silver that may be employed in an electronic device. This disclosure describes sintering nanoparticles at a temperature of 120 C. However, applicants have demonstrated that the nanoparticles may have a relatively low conductivity when sintered at these temperatures. Applicants have determined through experimentation that compositions employing nanoparticles of 40 nm diameters are typically heated to 200 degrees C. or even 250 degrees C. to form adequately electrically conductive layers. Although lower temperatures may be employed with smaller-diameter particles, the sintering time tends to be longer. Moreover, the deposition and removal of any uncured composition may be difficult in the presence of any other environmentally sensitive materials. US2006/0073667 is hereby incorporated in its entirety by reference.

US2006/0057502 entitled, "Method of forming a conductive wiring pattern by laser irradiation and a conductive wiring pattern", published Mar. 16, 2006 by Okada et al., describes fine wirings made by a method having the steps of painting a board with a metal dispersion colloid including metal nanoparticles of 0.5 nm-200 nm diameters (preferably 1-30 nm), drying the metal dispersion colloid into a metal-suspension film, irradiating the metal-suspension film with a laser beam of 300 nm-550 nm wavelengths, depicting arbitrary patterns on the film with the laser beam, aggregating metal nanoparticles into larger conductive grains, washing the laser-irradiated film, eliminating unirradiated metal nanoparticles, and forming metallic wiring patterns built by the conductive grains on the board thus enabling an inexpensive apparatus to form fine arbitrary wiring patterns on boards without expensive photomasks, resists, exposure apparatus and etching apparatus. The method can make wirings also on plastic boards or low-melting-point glass boards that have poor resistance against heat and chemicals. US2006/0003262, by Yang et al., published Jan. 5, 2006, similarly discloses a method of forming a pattern of electrical conductors on a substrate, wherein metal nanoparticles may be mixed with a light absorbing dye, and the mixture is then coated on the substrate. The pattern is formed on the coated substrate with laser light, and unannealed material is removed from the substrate. The disclosures of US2006/0057502 and US2006/0003262 are hereby incorporated by reference herein in their entirety. Applicants have demonstrated that the process of removing unannealed material can damage underlying sensitive materials in light-emissive areas. Commercial, patterned deposition methods, such as inkjet devices, may not provide the resolution necessary to avoid occluding light emission from a top-emitter LED device.

Some LED devices, for example organic light-emitting diode (OLED) display devices, are environmentally sensitive and require humidity levels below about 1000 parts per million (ppm) to prevent premature degradation of device performance within a specified operating and/or storage life of the device. Control of the environment to this range of humidity levels within a packaged device is typically achieved by encapsulating the device or by sealing the device and a desiccant within a cover. Desiccants such as, for example, metal oxides, alkaline earth metal oxides, sulfates, metal halides, and perchlorates are used to maintain the humidity level below the above level. See for example U.S. Pat. No. 6,226,890, issued May 8, 2001 to Boroson et al. describing desiccant materials for moisture-sensitive electronic devices. Such desiccating materials are typically located around the periphery of an OLED device or over the OLED device itself.

In alternative approaches, an OLED device is encapsulated using thin multi-layer coatings of moisture-resistant material. For example, layers of inorganic materials such as metals or metal oxides separated by layers of an organic polymer may be used. Such coatings have been described in, for example, U.S. Pat. Nos. 6,268,695, 6,413,645 and 6,522,067. A deposition apparatus is further described in WO2003/090260 entitled "Apparatus for Depositing a Multilayer Coating on Discrete Sheets" by Pagano et al, Oct. 30, 2003. WO2001/82390 entitled "Thin-Film Encapsulation of Organic Light-Emitting Diode Devices" by Ghosh et al., published Nov. 1, 2001, describes the use of first and second thin-film encapsulation layers made of different materials wherein one of the thin-film layers is deposited at 50 nm using atomic layer deposition (ALD). According to this disclosure, a separate protective layer is also employed, e.g. parylene.

Among the techniques widely used for thin-film deposition is Chemical Vapor Deposition (CVD) that uses chemically reactive molecules that react in a reaction chamber to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Atomic layer deposition ("ALD") is an alternative film deposition technology that can provide improved thickness resolution and conformal capabilities, compared to its CVD predecessor. In the present disclosure, the term "vapor deposition" includes both ALD and CVD methods. The ALD process segments the conventional thin-film deposition process of conventional CVD into single atomic-layer deposition steps. Advantageously, ALD steps are self-terminating and can deposit precisely one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice in any process it is difficult to avoid some direct reaction of the different precursors leading to a small amount of chemical vapor deposition reaction. The goal of any process claiming to perform ALD is to obtain device performance and attributes commensurate with an ALD process while recognizing that a small amount of CVD reaction can be tolerated.

While CVD and/or ALD processes may be useful for encapsulating environmentally sensitive devices, such layers as described in the prior art tend to be insulating layers and therefore are not useful for improving the conductivity of transparent electrodes.

There is a need, therefore, for an improved method for providing increased conductivity to the transparent electrode of a top-emitting LED device that is scalable to large sizes, avoids heating materials in emissive locations to high temperatures, and avoids the use of chemical processes.

SUMMARY OF THE INVENTION

In accordance with one embodiment, the invention is directed towards a method for improving power distribution of a transparent electrode that includes forming an LED over a substrate; the LED including a first electrode, a transparent electrode, and one or more light-emissive layers formed there-between. A patterned protective layer is formed on the transparent electrode; the patterned protective layer having open areas wherein the protective layer is not present and covered areas wherein the protective layer is present. A solution having curable conductive precursor components is deposited over the open areas onto the transparent electrode. The precursor components of the solution are pattern-wise cured to form patterned electrically conductive areas on the transparent electrode in the open areas, and any uncured precursor components of the solution are removed.

Another aspect of the invention is an LED device with improved power distribution, wherein the LED is formed over a substrate; the LED includes a first electrode, a transparent electrode, and one or more light-emissive layers formed there-between. A patterned protective layer is formed on the transparent electrode; the patterned protection layer having open areas wherein the protective layer is not present and covered areas wherein the protective layer is present. The LED also includes a solution of electrically conductive curable components deposited in the open areas.

Advantages

Various embodiments of the present invention have the advantage of improving the power distribution in a top-emitter LED device.

It will be understood that the figures are not to scale since the individual layers are too thin and the thickness differences of various layers too great to permit depiction to scale.

DETAILED DESCRIPTION OF THE INVENTION

Figure 1:
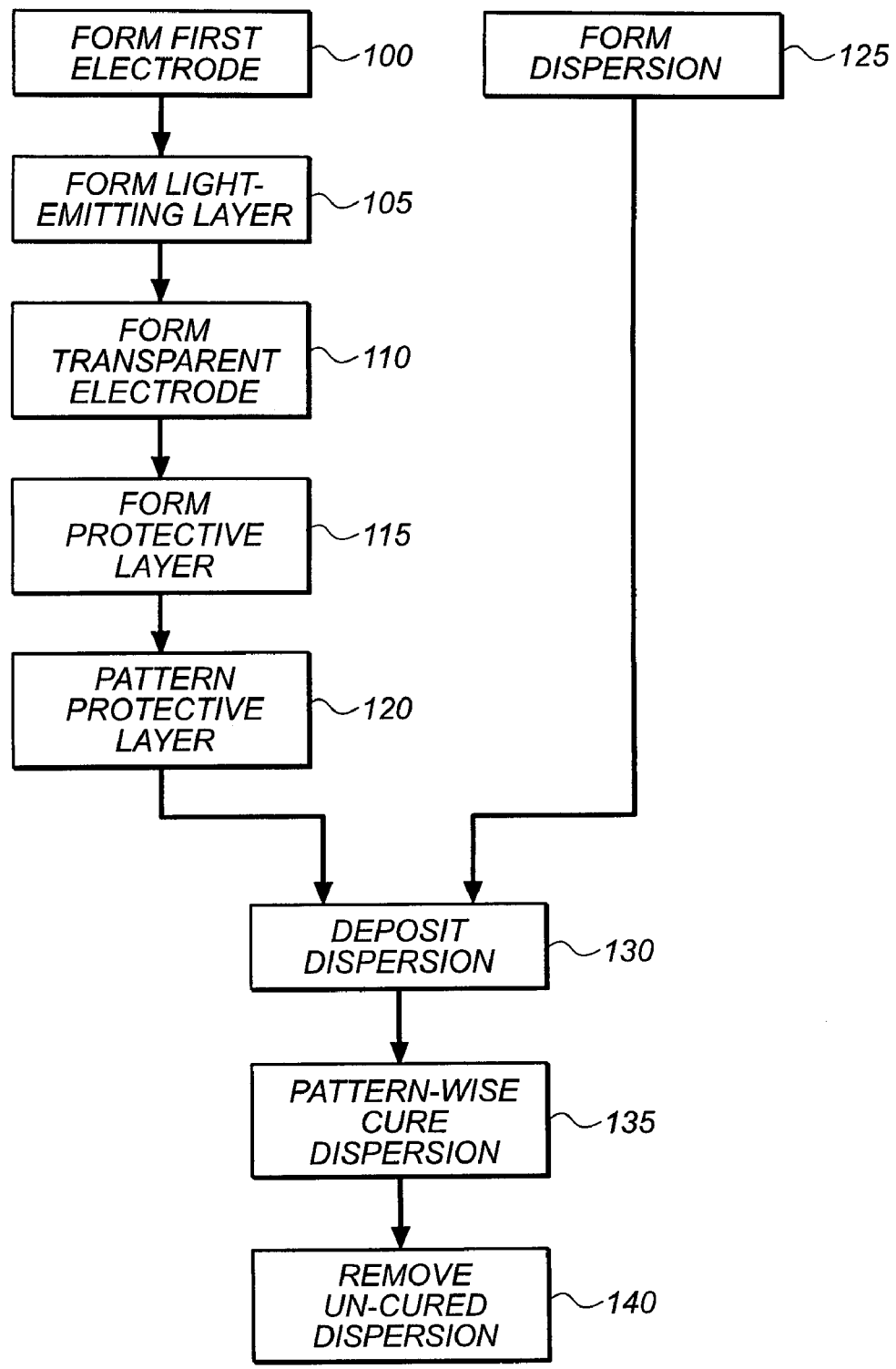
FIG. 1 is a flow diagram describing a method according to an embodiment of the present invention.

Referring to FIG. 1, a method for improving power distribution of a transparent electrode in a light-emitting diode (LED) device, comprises the steps of forming an LED over a substrate, the LED including a first electrode, a transparent electrode, and one or more light-emissive layers formed there-between. The LED is made by forming 100 a first electrode over a substrate, forming 105 one or more light-emissive layers over the first electrode, and then forming 110 a transparent electrode over the light-emissive layers to make a light-emitting diode (LED). A patterned protective layer is formed on the transparent electrode, the patterned protective layer having open areas wherein the protective layer is not present and covered areas wherein the protective layer is present. For example, an unpatterned protective layer may be first formed 115 by a chemical vapor deposition process over the transparent electrode and then patterned 120 using laser ablation. A solution, for example, a dispersion, containing conductive curable precursor components may be formed 125 before, after, or at the same time as the LED and protective layer. The solution is deposited 130 over the protective layer and through the open areas of the protective layer and onto the transparent electrode, for example, by employing slide, hopper, spray, or inkjet deposition methods known in the art. The solution is pattern-wise cured 135 in the open areas to form patterned conductive areas in electrical contact with the transparent electrode and thereby providing additional conductivity to the transparent electrode. Uncured solution in the covered areas 52 is then removed 140 to prevent any dispersed components from absorbing emitted light.

Figure 2:
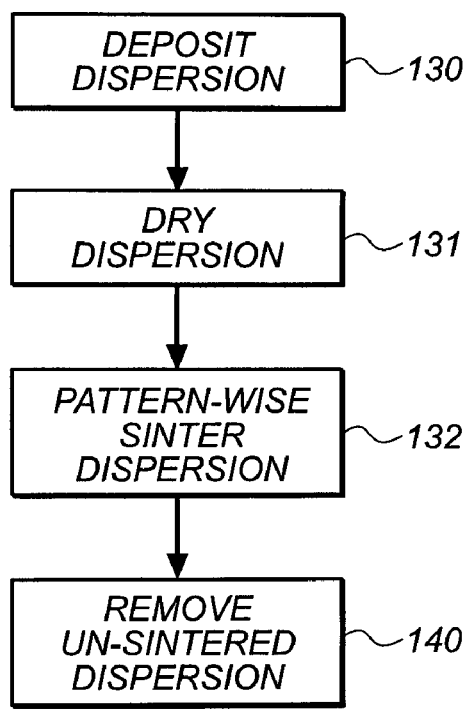
FIG. 2 is a flow diagram describing an alternate method according to an embodiment of the present invention.

Referring to FIG. 2, in an additional embodiment of the method of the present invention, the solution may be cured by first depositing 130 the solution over the protective layer in the open areas. The solution is then dried 131, for example, by exposure to mild heat. The solution may include, for example, solvents such as toluene, xylene, or cyclohexane that are readily evaporated once deposited on a surface. Useful conductive precursor components can include, for example, silver nano-particles in the solution. Once dried, the solution is pattern-wise cured by sintering 132 the silver nano-particles by exposure to radiation, for example, a laser beam tracing out a pattern over the substrate in the open areas. The remainder of the un-sintered material in the covered areas may be removed 140, for example by washing away with an agent such as cyclohexane. Alternatively, UV-curable conductive inks may be employed and exposure to UV light may serve to cure the conductive in precursor components. The protective layer and cured precursor components can protect the LED from the washing agent.

Figure 3:
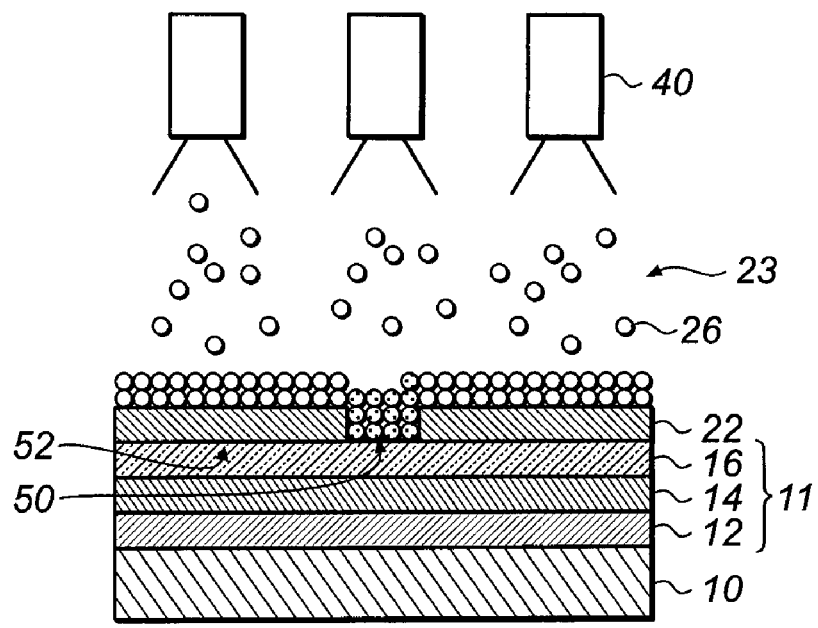
FIG. 3 is a partial cross section of a top-emitter LED device showing deposition according to an embodiment of the present invention.
Figure 4:
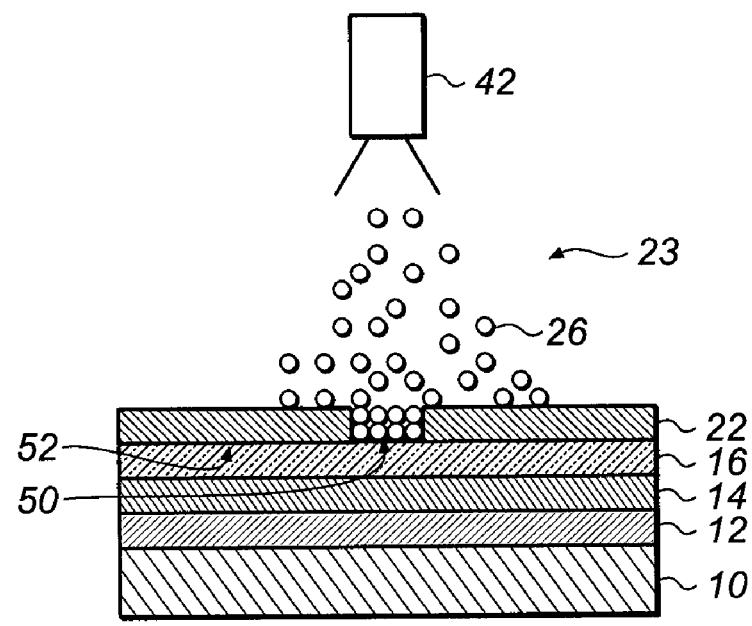
FIG. 4 is a partial cross section of a top-emitter LED device showing alternate means of deposition according to another embodiment of the present invention.

Referring to FIG. 3, an LED device having improved power distribution comprises an LED 11 formed over a substrate 10, the LED including a first electrode 12, a transparent electrode 16, and one or more light-emissive layers 14 formed there-between. A patterned protective layer 22 formed on the transparent electrode 16 has open areas 50 wherein the protective layer 22 is not present and has covered areas 52 wherein the protection layer 22 is present. A cured solution 54 including electrically conductive components 26 is formed in the open areas 50. The solution 23 may be a liquid, for example, comprising a solvent and electrically conductive precursor components 26 deposited in an unpatterned fashion over the protective layer 22 with one or more spray devices 40. In an alternative embodiment shown in FIG. 4, solution 23 may be pattern-wise deposited with an inkjet device 42. Because in commercial inkjet devices it may not be possible to deposit a solution at a high enough resolution, the solution 23 may be deposited over the open areas 50 and also in the environs of the open areas 50.

Figure 5:
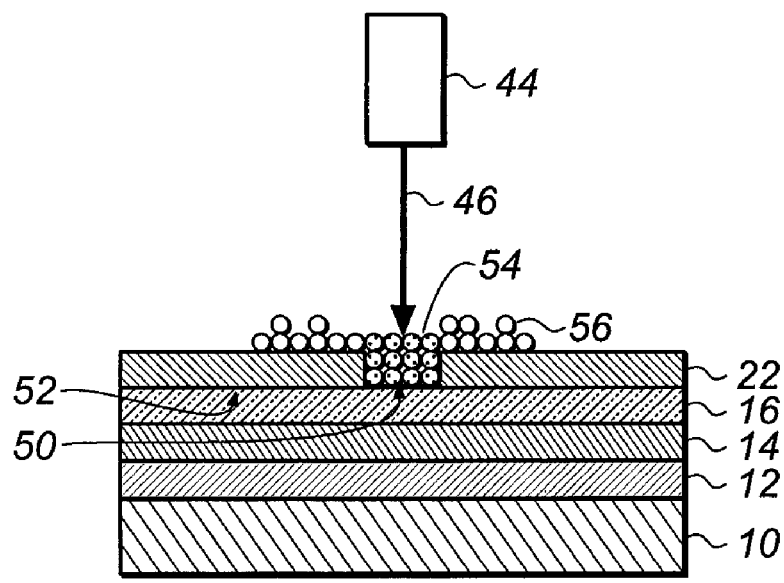
FIG. 5 is a partial cross section of a top-emitter LED device showing curing according to an embodiment of the present invention.
Figure 6:
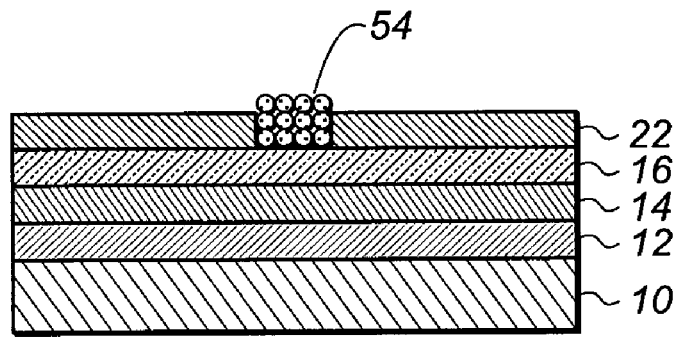
FIG. 6 is a partial cross section of a top-emitter LED device showing a patterned cured dispersion according to an embodiment of the present invention.
Figure 7:
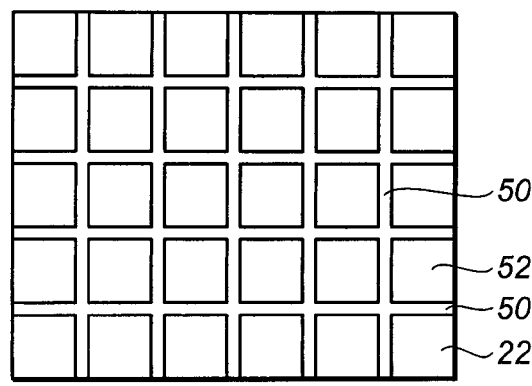
FIG. 7 is a top view of a transparent electrode according to an embodiment of the present invention.

Referring to FIG. 5, once deposited, the solution may be dried, for example, by exposure to mild heat and then pattern-wise cured by employing a laser 44 having a directed laser beam 46. Laser beams and the mechanical and optical means to pattern-wise control the beam over a substrate are well known in the art and have been demonstrated by applicant. The directed laser beam 46 can sinter the dried electrically conductive precursor materials 56 to form a cured solution 54 providing increased electrical conductivity in the open areas 50. The uncured dried electrically conductive precursor materials 56 are removed, for example, by washing with a mild solvent, for example, cyclohexane, or by a combination of blowing gas and vacuum. FIG. 6 shows the result having cured solution 54. FIG. 7 shows a top view of the transparent electrode 16 with a grid pattern of open areas 50 separating covered areas 52 in a protective layer 22.

Figure 8:
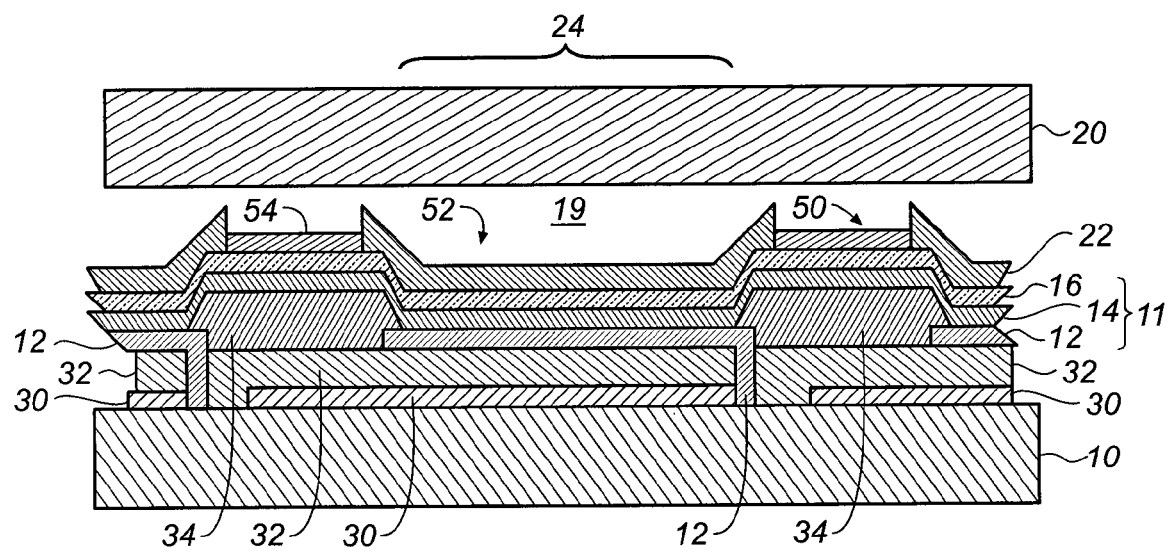
FIG. 8 is a partial cross section of a top-emitter LED device showing a patterned cured dispersion according to an embodiment of the present invention.

Referring to FIG. 8, a more complete cross section of a multi-element LED display device is illustrated having a substrate 10 (reflective, transparent, or opaque). Over the substrate 10, a semiconducting layer is formed providing thin-film electronic components 30 for driving an LED. An interlayer insulating and planarizing layer 32 is formed over the thin-film electronic components 30 and a patterned reflective electrode 12 defining LED light-emissive elements is formed over the insulating layer 32. An inter-pixel insulating film 34 separates the elements of the patterned reflective electrode 12. One or more layers 14 of light-emissive materials and any desired charge-control materials, are formed over the patterned reflective electrode 12. A transparent electrode 16 is formed over the one or more layers 14 of organic material to form an LED 11. A patterned protection layer 22 having closed areas 50 and open areas 52 protects the transparent electrode 16 and underlying light-emissive layers 14. A patterned conductive cured solution 54 is formed in the open areas 50. A gap 19 separates the transparent second electrode 16 and protective layer 22 from an encapsulating cover 20. The encapsulating cover 20 is transparent and may be coated directly over the transparent electrode 16 so that no gap 19 exists.

Figure 9:
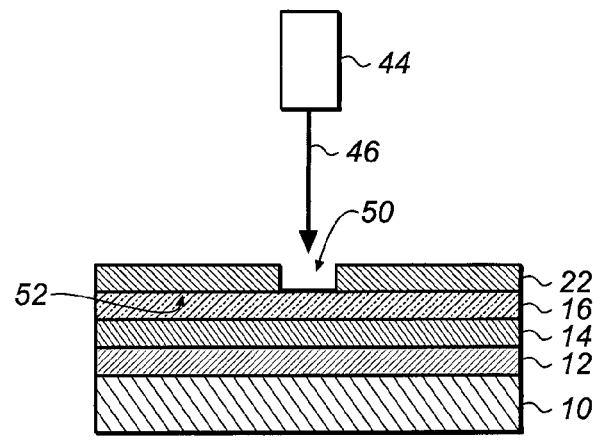
FIG. 9 is a diagram illustrating the use of beam of light to cure the solution according to the present invention.

Referring to FIG. 9, the protective layer 22 may be patterned by exposure to a patterned beam of radiation 46 that locally ablates or melts the protective layer 22 in the open areas 50. Such a directed radiation beam 46 may be formed, for example, by a laser 44. Applicants have demonstrated the formation of open areas 50 in an organic protective layer 22 using such a directed laser beam. In a further embodiment of the present invention, the protective layer 22 is transparent to facilitate the emission of light from the LED 11. Such a transparent protective layer may not absorb sufficient radiation to form open areas 50 without damaging other layers in an OLED system. Hence, to facilitate the absorption of radiation, light or heat absorbing elements 58 shown in (FIG. 10) may be formed over the substrate 10 in the open areas 50. The protective layer 22 is then patterned by exposure to radiation that is absorbed by the light or heat absorbing elements to facilitate local ablation or melting of the protective layer in the open areas. Preferably, the open areas and the light or heat absorbing elements 58 are formed between light-emissive areas 24 in an LED device, to reduce the likelihood of damage to the light-emissive layer 14 in the light-emissive area 24. Alternatively, the open areas 50 may be located in emissive areas 24.

The light or heat absorbing elements 58 may be employed for both the formation of the open areas 50 in the protective layer 22 and to locally cure the solution to form electrically conductive areas.

In one embodiment of the present invention, the protective layer 22 absorbs most highly in the ultraviolet region of the electromagnetic spectrum. The absorption protects any sensitive layers from ultraviolet radiation, but also enables the use of an ultraviolet radiation for ablating or curing material. Alternatively, infrared radiation may be employed, or other frequencies of radiation.

Figure 12:
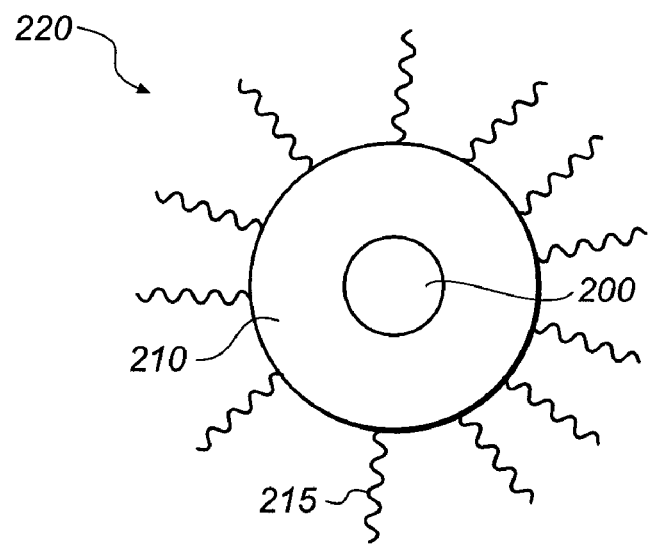
FIG. 12 is a cross section of a core/shell light-emitting nano-particle according to an embodiment of the present invention.
Figure 13:
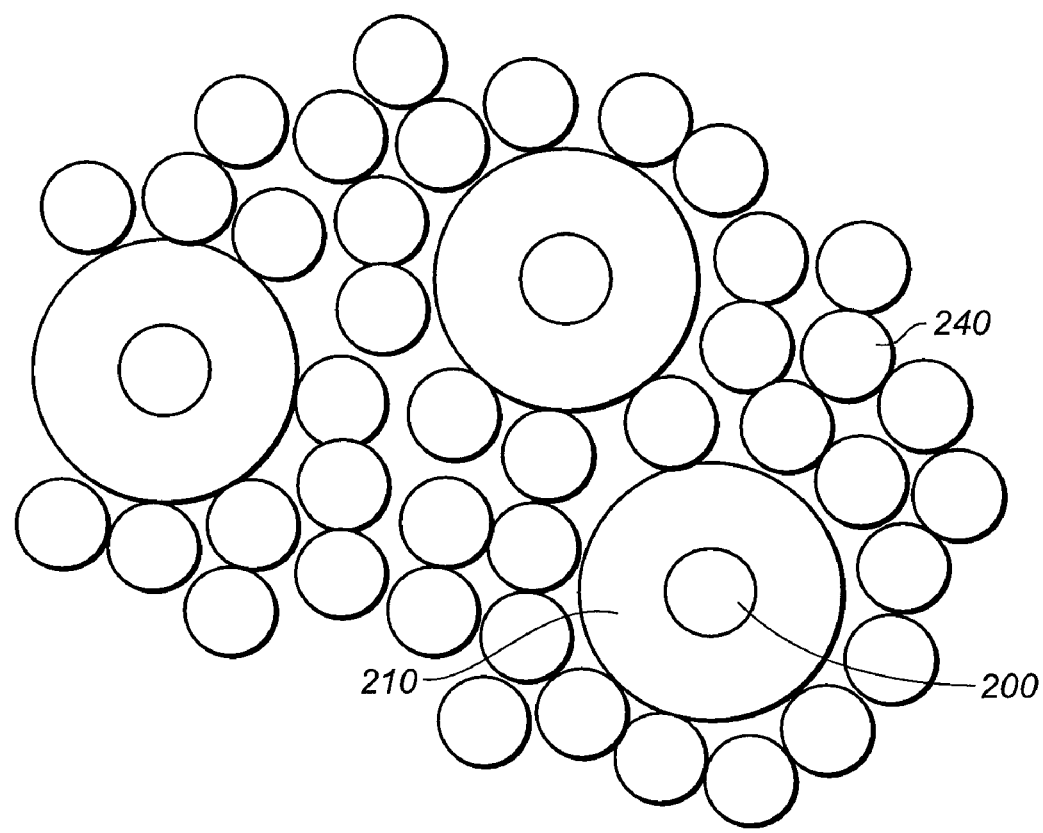
FIG. 13 is a cross section of a light-emitting layer including core/shell light-emitting nano-particles and conductive nano-particles according to an embodiment of the present invention.

The light-emissive layers may comprise organic materials, for example as taught in the OLED art or inorganic materials, for example core/shell quantum dots in a polycrystalline semiconductor matrix as shown in FIGS. 12 and 13. As shown in FIG. 12, a core/shell light-emitting nano-particle 220 may have a core 200, shell 210, and ligands 215. As shown in FIG.

13, the core/shell light-emitting nano-particles 220 may be combined with conductive nano-particles 240 in a semiconductor matrix to form a light-emissive layer 14, as described in co-pending, commonly assigned U.S. Ser. No. 11/226,622, which is hereby incorporated by reference in its entirety.

By employing patterned deposition through openings in a protective layer, the present invention avoids the use of photolithographic techniques or cleaning techniques that may damage environmentally sensitive layers. Moreover, by employing a solution that is subsequently cured, for example by patterned exposure, the device need not be heated to a high temperature that can damage environmentally sensitive layers.

As employed in this disclosure, a sintering process is an annealing process and refers to the heating of a group of individual conductive particles with limited conductivity, so that the particles cohere to form a single, more highly conductive structure. Essentially, small metal (preferably silver) particles are melted, or welded, together to form a conductive metal structure such as a conductive trace. Moreover, the sintering process will generally cause the cohered particles to adhere to the surface on which the cohered particles rest. Applicants have noted that, although the use of small metal nano-particles promotes some sintering at a relatively lower temperature (e.g. 120 C rather than 250 C or higher), such sintering is incomplete unless conducted for a relatively long time (e.g. more than 10 minutes, more than 20 minutes, or even more than 30 minutes). According to the present invention, the nano-particles may be pattern-wise adhered to the transparent electrode 16 with a quick, relatively low-energy laser exposure (resulting in a temperature sufficient to cause adherence, but not complete sintering), the non-adhered particles removed, and the entire device then heated for a relatively longer time at a relatively low temperature to complete the sintering process. Because the low-temperature, relatively slow sintering process may be done in batch form without the use of patterning equipment, the present invention provides a lower-cost and more productive manufacturing method. Moreover, the use of relatively low-energy patterning equipment also improves manufacturing throughput and reduces costs.

According to the present invention, the metal nanoparticles may preferably have an average diameter of from 1-30 nanometers, more preferably of from 1-5 nanometers. Silver may be employed in the nano-particles as well as a mixture of metals.

The deposition of a transparent electrode by using conventional means such as sputtering may damage underlying organic layers in organic light-emitting devices (OLED) embodiments of the present invention. Less damage to the underlying organic layers may be formed by reducing the energy of the sputtering process, or reducing temperatures, but a transparent electrode with a relatively lower conductivity will typically be obtained. The use of a patterned conductive open area 50 in conjunction with such a reduced conductivity transparent electrode 16 can provide the necessary overall conductivity necessary for a given application, while reducing damage to the organic layers.

A variety of means may be employed to coat the metal nano-particles over the LED. For example, nanoparticles may be formed in a liquid suspension containing metal nano-particles using a solvent compatible with the transparent electrode (e.g. toluene, xylene, or cyclohexane). The liquid suspension may, or may not, include light-absorbing dyes and the LED may, or may not, include other light-absorbing layers. Such layers, for example, may be employed to enable selective light absorption and heating to enable localized curing, for example through exposure to a beam of light or a patterned beam of light. The liquid suspension may be deposited in a layer by any of several methods practiced in the microfabrication industry, including, but not limited to spin coating, spray coating, hopper coating, meyer rod coating, gravure coating, offset printing, flexography, inkjet coating, dip coating, supercritical $CO_2$, vapor deposition, and plasma vacuum deposition. The liquid suspension may be heated above 20 degrees C. and less than or equal to 120 degrees C. to form a dried layer. Alternatively, the liquid suspension may be heated at less than or equal to 100 degrees C. In yet another alternative, the liquid suspension may be heated at less than or equal to 80 degrees C. Heating during the drying process should be limited to avoid sintering, and therefore adherence, of the unpatterned coating.

The LED device preferably may be heated after removal of the non-adhered metal nanoparticles to a temperature greater than that employed to heat the liquid suspension to form a dried layer, but it is still preferred to limit heating to a temperature that will minimize damage to the LED material components. For example, the LED device may be heated after removal of the non-adhered metal nanoparticles to a temperature less than or equal to about 150 degrees C. Alternatively, the LED device may be heated after removal of the non-adhered metal nanoparticles to a temperature less than or equal to about 120 degrees C. or to a temperature above 80 degrees C. In other embodiments, the LED device may be heated after removal of the non-adhered metal nanoparticles to a temperature from about 80 to about 150 degrees C. In general, applicants have discovered that over very long periods, for example, months, metal nano-particles gradually adhere to an underlying surface, and even sinter, at room temperature. Nonetheless, because the coatings tend to cure, it is important to expeditiously pattern the layer so that the metal nano-particles may be easily removed from areas in which no additional conductive traces are desired. Hence, according to the present invention, the metal nanoparticles may be partially sintered when pattern-wise adhered to the second electrode, and further sintered when the LED device is heated after removal of the non-adhered metal nanoparticles to increase the conductivity of the pattern-wise adhered metal nanoparticles.

The substrate 10 could be any material suitable for forming an LED, including glass, a silicon wafer, a metal such as stainless steel, and the like. Flexible supports could be used as well, including polyethylene terephthalate, polyethylene, polypropylene, polyethylene naphthalate, polysulphone, polyimides, and the like. Alternatively, the substrate 10 can be any preliminary substructure of a final device, which may include functional layers, registration marks for alignment, as for example the various layers of a thin film transistor array backplane for LCDs or OLED displays.

Figure 10:
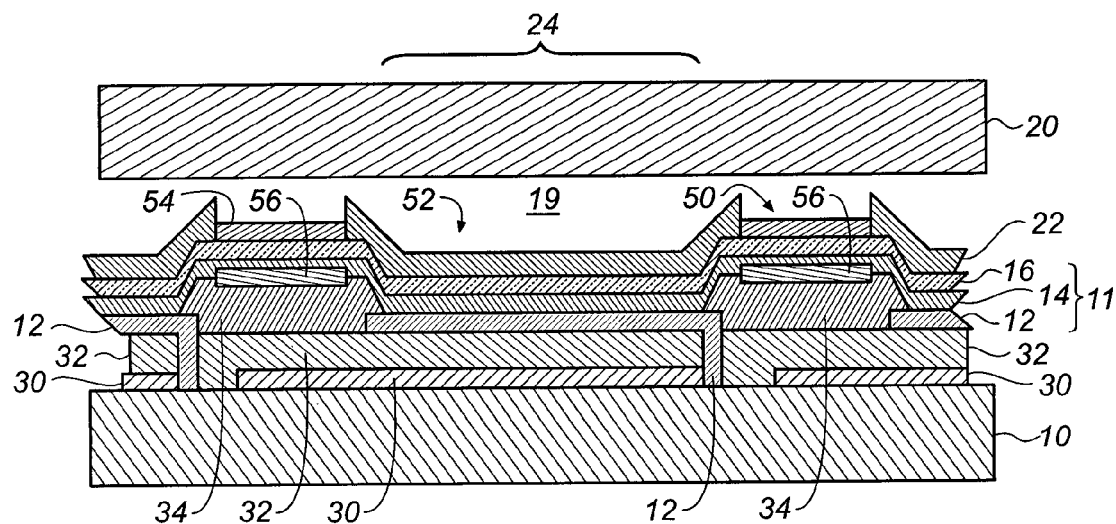
FIG. 10 is a partial cross section of a LED device having heat absorbing areas according to the present invention.
Figure 11:
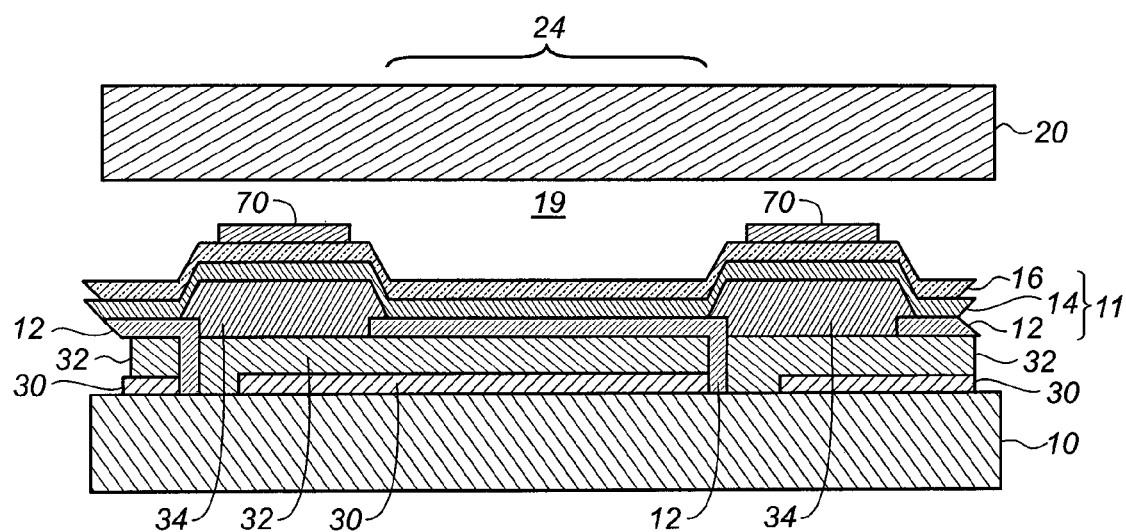
FIG. 11 is a partial cross section of a top-emitter OLED device having an auxiliary electrode as described in the prior art.

The present invention may be employed in LED devices having only a single light-emissive area. Alternatively, a plurality of light-emissive areas may be formed by patterning an electrode, for example, the transparent or the reflective electrode, as shown in FIG. 10. The patterned conductive areas 50 may be between light-emissive areas or within them. A black matrix may be provided between the light-emissive areas or over the patterned conductive open areas. Applicants have demonstrated that the provision of sintered nano-particle conductors to form patterned conductive areas over a transparent electrode 16 improves the conductivity of the electrode. Patterned conductive areas 50 between light-emitting areas 24 may, for example, have a width of 20-50 microns depending on the LED design, while patterned conductive open areas in the light-emitting areas 24, if employed, may be less than 20 microns, preferably less than 10 microns, and may be 5 microns wide. Applicants have demonstrated the formation of such patterned nano-particle conductors at widths of 5 microns.

In yet a further embodiment of the present invention, the patterned conductive areas 50 may be directly connected to an external power or ground buss 19. By directly connecting the patterned conductive areas 50 to an external power or ground buss, the overall resistance of a transparent electrode 16 is reduced.

Lasers, such as ultraviolet or infrared lasers, may be employed to locally pattern-wise adhere the nano-particles. Preferably, the pattern is provided by a modulated laser beam or an array of such beams. The laser radiation may pattern-wise expose the dried suspension by employing a variety of means, for example, a drum print or an x-y stage with a laser of an appropriate wavelength. This laser can be directly modulated via current to the laser or may be modulated by a spatial light modulator such as an acousto-optic modulator.

Although, according to the present invention, less heat is necessary to adhere the nano-particles than to fully sinter them, radiation-absorbing material can be employed in the suspension to improve heat absorption by the dried suspension and can be a light-absorbing component (for example, IR or UV dyes such as the dyes specified in commonly assigned U.S. Pat. Nos. 4,973,572 to DeBoer and 5,578,416 to Tutt, a pigment such as carbon black, or light-absorbing metal particles) whose spectrum matches the spectrum of the laser may be included to absorb radiation to produce heat which causes adhesion of the metal nanoparticles. However, because of the superior performance of the nano-particulate suspension described below, for some embodiments the light-absorbing components may not be required. When employed with a laser, the efficiency of the heating is well known to depend on the laser fluence, spot size, beam overlap and other factors.

Applicants have discovered through experimentation that the use of silver nano-particles having a mean major axis diameter of approximately equal to or less than 5 nm improves the adhesion and sintering of the particles to form a conductor at lower temperatures and with equivalent conductivity. Such particles may sinter to form useful conductors at temperatures equal to or less than 120-130 degrees.

Figure 14:
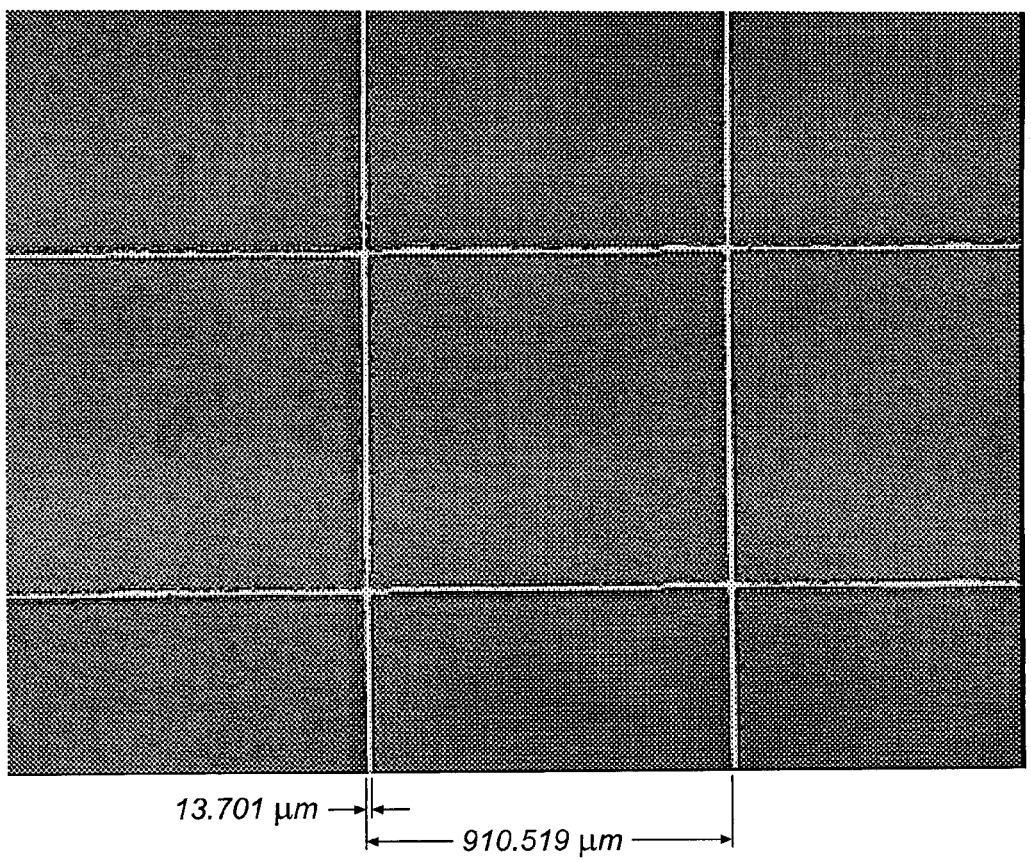
FIG. 14 is a photomicrograph of conductive areas on an ITO transparent electrode according to an embodiment of the present invention.

FIG. 14 is a photo-micrograph of nano-particle conductors formed on an ITO transparent conductor by coating a layer of metal nanoparticles over the transparent conductor, pattern-wise adhering the metal nanoparticles to the transparent conductor, removing non-adhered metal nanoparticles from the transparent conductor, and heating the OLED device after removal of the non-adhered metal nanoparticles to increase the conductivity of the pattern-wise adhered metal nanoparticles. The conductors are formed to be 13.701 microns wide in both dimensions and on a 910.519micron pitch. These sizes are chosen to be suitable for pixilated, top-emitting OLED devices. The resistance of the combination is measured by a standard four-point probe at 5.46 ohms per square. Top-emitting LED devices using conventional ITO deposition processes are expected to have a resistance of 50-100 ohms per square. In a second experiment, patterned conductive areas 50 are patterned on 170-micron centers over an ITO transparent conductor 16. Approximately 8-micron wide patterned conductors are also formed in one direction and the resistance of the coating is reduced from 5.46 to 4.95 ohms/square.

In further embodiments of the present invention, optically active structures may be formed by the patterned conductive areas 50 in the light-emitting areas 24. For example, wire-grid polarizers, diffractors, and reflectors may be formed.

The carrier liquid comprising the liquid solution should not degrade LED performance by outgassing harmful materials, corroding a patterned conductive layer or contaminating the LED. For example, cyclohexane, cyclopentane, xylene, or toluene may be used.

The patterned nano-particle conductive open areas 50 are formed over the transparent electrode 16 and are more conductive than the transparent electrode 16, thereby improving the distribution of power to the LED 11 by reducing the sheet resistivity of transparent electrode 16 across the device as well as reducing the resistive heating and voltage drop in the transparent electrode 16. Moreover, the nano-particle conductor may serve to conduct heat itself, thereby improving the lifetime of the LED. The nano-particles can comprise any conductive material that can be suitably formed into sinterable nano-particles but are preferably metal, and more preferably silver.

Additional particles included in the solution may usefully separate the LED 11 from the cover 20 and provide space for useful optical structures, including a low-index gap as taught in co-pending, commonly assigned U.S. Ser. Nos. 11/065,082 filed Feb. 24, 2005 and 11/241,370 filed Sep. 30, 2005, the disclosures of which are hereby incorporated in their entirety by reference. Multiple layers of such liquid solutions may be cured to form thicker conductors. Alternatively, a liquid solution may include spacer particles larger than the metal nano-particles to separate the cover 20 from the LED 11. The use of spacer particles is taught in co-pending, commonly assigned U.S. Ser. No. 11/179,409 filed Jul. 12, 2005, the disclosure of which is hereby incorporated in its entirety by reference.

Pattern-Wise Exposure System

In one embodiment of the present invention, a laser system may be employed to adhere metal nano-particles that include a non-coherent infrared diode laser bar at 808 nm (+/−10 nm) whose beam is divided into 256 separate addressable channels modulated by a spatial light modulator at 5-micron intervals across the beam's width, as described in U.S. Patent Application Publication No. 2005/0266172 (Kay et al.), which is incorporated herein by reference in its entirety. The beam intensity distribution in the fast scan direction is a Gaussian whose 1/e2 diameter value is 3.6 micrometers. Peak-to-peak distance in the fast-scan direction was limited by the modulation scheme to 5 microns for the examples of this invention yielding a minimum ablated spot at the film plane of about 5 microns maximum representing 1 pixel in any image rendition. The beam may be scanned across the surface by a two-axis movable stage that holds the substrate. Exposure occurs as the fast-scan axis movable stage ran at speeds between 1.0 and 0.1 meter per second. The powers available on this laser system were between 11 and 55 milliwatts per channel corresponding to a total exposure range of between 0.22 and 11 J/cm2, although the powers and exposures useful for this invention are not limited to these ranges. The slow-scan axis movable stage increments the sample a set distance in preparation for another fast scan motion. This sequence continues until the total desired area is exposed.

Substrate 10 may be held against the stage by a vacuum, although those skilled in the art will recognize that many other means exist for affixing the substrate to the stage, for example by clamping, application of pressure, adhesives, with optional heating of the substrate or the like, and including means for accurate placement and registration of the substrate with respect to the ablative pattern. One example of a fixture for this positioning is disclosed in commonly-assigned U.S. Pat. No. 6,695,029 (Phillips et al.), the disclosure of which is hereby incorporated by reference. It is preferable that transfer take place under powers available were between 11 and 55 milliwatts per channel corresponding to a total exposure range of between 0.4 and 11 J/cm2. The movable stage can support a substrate oriented either with the suspension-side face towards or away from the laser source when working with transparent substrates 10. The pattern information is provided by means of a CPU and a RIP capable of processing test patterns.

Any infrared or visible YAG laser system could be used in conjunction with this invention, which is not limited to the laser system described above. The array of lasers could be an assembly of discrete diodes as in the Kodak Approval Digital Proofing System™, or bar laser with a segmented light modulator as in the Kodak Newsetter™ or the Creo Trendsetter Plate Writer-Proofers™. The device for transporting the substrate 10 could be a flatbed for rigid substrates and relative motion could be provided by moving either the laser array or the support stage. Drum systems utilizing flexible supports could also be considered, as well as laser arrays mounted in the suitable proximity for a moving web of substrate 10. There is no limitation to the number of addressable channels or lasers comprising the array, other than the practical limits of the devices themselves, and the ability or the CPU to deliver the information at the appropriate rate. More than one head could be employed simultaneously.

Modulation of the laser power on the plane of dried suspension to produce the desired adhesion pattern could be accomplished by any means known if the art, such as binary exposure in the on or off mode as practiced in the laser system of this invention, or by pulse width modulation. The only requirement is that the power in the on mode be sufficient to cause ablation at the scan speed chosen.

Alternatively, pattern-wise radiation may be supplied through a mask to the dried suspension from any non-laser source such as a Xenon flash, or any other radiation source with a high enough intensity at the absorptive wavelengths of the thermal suspension to suitably adhere the metal nanoparticles.

Light to-Heat-Converting Substance

Although the present invention does not require the use of additional dyes in the solution, dyes may be employed to reduce exposure time. IR absorbing dyes included in this invention are specified in commonly assigned U.S. Pat. Nos. 4,973,572 (DeBoer) and 5,578,416 (Tutt), or described in "Infrared Absorbing Dyes" (ed. Masaru Matsuoka, Plenum Press, 1990). Dye types useful for this invention include, but are not limited to, Cyanines, Squaryliums, Croconiums, Pyryliums, Quinones, Phthalocyanines and their metal complexes, Naphthalocyanines and their metal complexes, azo dyes, and Intermolecular Charge Transfer Complexes. Those skilled in the art will recognize that the radiation absorbing chromophores or this invention can be presented to the dried suspension as either monomolecular dyes or as pigment particles depending on the particular properties of the absorber, which may also include a carbon black, a metal nanoparticle, or a carbon nanotube. Other radiation absorbers useful for this invention are metals or inorganic materials such as chromium, nickel, titanium, molybdenum, tungsten, zirconium, alloys such as NiCr, MoCr, WTi, and the like, oxygen-deficient oxides of metals such as aluminum or chromium oxides and the like, or a layered stack of materials that absorb radiation by virtue of their antireflection properties. The main criteria is that radiation-absorbing substance absorb laser light at the given wavelength of the pattern-wise radiation, at a high enough extinction for local heating of the dried suspension to promote adhesion. The efficiency of this transfer is well known to depend on the laser fluence, spot size, beam overlap and other factors. Generally, the optical density of radiation-absorbing material should be at least 0.1 (20% of the light is absorbed).

The radiation absorbers may be present in the dried suspension as a monomolecular species dissolved in the organic binder of said suspension. Alternatively, the radiation absorbing substances can be applied to the dried suspension in a variety of methods known in the art, such as but not limited to, spin coating, spray coating, hopper coating, gravure, offset printing, flexography, ink jet deposition, supercritical $CO_2$, and the like, from a suspension that may or may not include a binder material. Other methods of application include vacuum or vapor deposition.

Nano-Particles

The nano-particles can be any metal or semimetal which can be made to form nanoparticles and are dispersable in a solvent. The main criterion for choosing a solvent for the nanoparticles is that the solvent be compatible with underlying layers of the OLED device. For example, cyclohexane, cyclopentane, xylene, or toluene may be employed.

Examples of metals that may be used to form nanoparticles include, but are not limited to: silver, gold, and nickel. The nanoparticles may also be formed as a mixture or two or more metals, for example as an alloy or as a core shell particle wherein one metal is the core and another surrounds the outside.

The nanoparticles are small enough that the temperatures to melt them have been reduced. In many case the temperatures are hundreds of degrees below the pure materials. To allow good adhesion or sintering, all that is typically necessary is to heat the nano-particles at the preferred temperature.

The nanoparticles are typically stabilized with an organic shell that allows dispersal in solvent and stabilization to spontaneous sintering. The organic coating is selected for optimal thermal stabilization, low temperature adhesion and sintering, and desired solvent dispersal. Upon heating, the organic coating is typically released.

One embodiment uses silver nanoparticles formed with a dodecylamine shell dispersed in cyclohexane. The dodecylamine binds moderately to the silver nanoparticles allowing stable dispersement in cyclohexane.

The nanoparticles are porous and have low cohesive strength. The cohesive forces or the nanoparticles are small and unlike pure metal coatings will not tend to bridge gaps and instead "tear" cleanly, allowing good edge definition.

In the final step, heating of the nano-particles causes melting or sintering to coalesce the nanoparticles and thereby increase the conductivity. The heating can be conducted by any means that raises the temperature above the sintering temperature. Example methods include but are not limited to oven heating, hot plates, radiant heaters, thermal conduction, hot air, microwave, or photothermal.

Ag(0) Nanoparticle Dispersion Preparation

Eighty-one grams (g) of cyclohexane, 68 g of silver acetate, 740 g of dodecylamine was added to a 22-liter, 3-neck, round reaction flask equipped with a stir rod, cold water condenser and an addition funnel containing 21 of cyclohexane/44 g of phenylhydrazine/100 ml toluene. After dissolving all silver acetate in suspension, added chemicals in addition funnel dropwise to the reaction flask. The mixture was stirred at 60° C. for 1 hour before being cooled down to room temperature. Subsequently, 21 of acetone was added. The dispersion was concentrated via vacuum evaporation at 45° C. To the resulting concentrated reaction mixture was added 101 g of 50/50 methanol/acetone to precipitate the silver nanoparticles with yield of 48.81 g. The Ag(0) nanoparticles dispersion was made by dissolving the silver nanoparticles in cyclohexane to obtain a 10% by weight suspension. Average particle size of the nanoparticles was approximately 4 nm.

In alternative further embodiments of the present invention, a scattering layer may be optically integrated with the electrodes 12 and 16 respectively and the light-emissive layers 14. As described in co-pending, commonly assigned U.S. Ser. No. 11/065,082, filed Feb. 24, 2005, the disclosure of which is hereby incorporated by reference, light emitted by the organic layers of an OLED may be trapped within the OLED device and a scattering layer may be employed to scatter the trapped light out of the OLED device. As employed herein, a light-scattering layer is an optical layer that tends to randomly redirect any light that impinges on the layer from any direction. Optically integrated means that light emitted by the light-emissive layers encounters the scattering layer before traveling through other layers having an optical index lower than those of the organic materials or electrodes.

A color filter may be located over the entire extent of the transparent electrode 16 or display area 24. The color filter may be formed on a scattering layer, if present, or on a transparent electrode or any protective or encapsulating layers formed on a transparent electrode or formed on the cover or substrate of a top-emitting or bottom-emitting LED device, respectively. In this case, both emitted and ambient light that is reflected within the LED device may pass through the filter multiple times.

Although LED layer structures have been primarily described with a cathode on the top and an anode on the bottom near the substrate, it is well known that the locations of the light-emissive layers can be inverted and the positions of the anode and cathode exchanged. Both such structures are included in the present invention.

Various conductive and scattering materials useful in the present invention, as well as the employment of scattering layers for extracting additional light from the device are further described in co-pending, commonly assigned U.S. Ser. No. 11/065,082, filed Feb. 24, 2005, incorporated by reference above. Additional layers may be usefully employed with the present invention. For example, one problem that may be encountered with scattering layers is that the electrodes may tend to fail open at sharp edges associated with the scattering elements in the scattering layer. Although the scattering layer may be planarized, typically such planarizing operations do not form a perfectly smooth, defect-free surface. To reduce the possibility of shorts between the transparent electrodes, a short-reduction layer may be employed over a scattering layer. Such a layer is a thin layer of high-resistance material (for example having a through-thickness resistivity between $10^{-7}$ ohm-cm$^2$ to $10^3$ ohm-cm$^2$). Because the short-reduction layer is very thin, device current can pass between the electrodes through the device layers but leakage current through the shorts are much reduced. Such layers are described in co-pending, commonly assigned U.S. Ser. No. 10/822,517, filed Apr. 12, 2004, the disclosure of which is incorporated herein by reference.

The present invention may also be employed with four-sub-pixel display designs for example, having a red, green, blue, and white emitter. A neutral density filter may be located over any of the emitters, but in particular may be employed with a white emitter to improve device contrast. Such color or neutral density filters may be located in any of the transparent openings taught herein.

LED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may be practiced with either active- or passive-matrix LED devices. It may also be employed in display devices or in area illumination devices. In a preferred embodiment, the present invention is employed in a flat-panel OLED device composed of small molecule or polymeric OLEDs, or employing inorganic emitters such as core/shell quantum dots as disclosed in but not limited to U.S. Pat. No. 4,769,292, issued Sep. 6, 1988 to Tang et al., and U.S. Pat. No. 5,061,569, issued Oct. 29, 1991 to VanSlyke et al., and Kahen reference. Many combinations and variations of light-emitting materials can be used to fabricate such a device, including both active- and passive-matrix LED displays having either a top- or bottom-emitter architecture.

The invention has been described in detail with particular reference to certain embodiments thereof, but it will be understood that variations and modifications can be effected within the spirit and scope of the invention.

PARTS LIST

10 substrate
11 light-emitting diode
12 electrode
14 light-emissive layer(s)
16 transparent electrode
19 gap
20 cover
22 protective layer
23 solution
24 light-emissive area
26 conductive curable precursor components
30 thin-film circuitry
32 insulator
34 insulator
40 spray device
42 inkjet device
44 laser device
46 directed laser beam
50 open area
52 covered area
54 cured solution
56 uncured solution
58 heat or light absorbing element
70 auxiliary electrode
100 form first electrode operation
105 form light-emitting layer operation
110 form transparent electrode operation
115 form protective layer operation
120 pattern protective layer operation
125 form solution operation
130 deposit solution operation
131 dry solution operation
132 pattern-wise sinter precursor components operation
135 pattern-wise cure precursor components operation
140 remove uncured precursor components operation
200 core
210 shell
215 ligand 220 core/shell quantum dot
240 conductive nano-particle

The invention claimed is:

1. A method for improving power distribution of a transparent electrode, comprising the steps of:
   a) forming an LED over a substrate, the LED including a first electrode, a transparent electrode, and one or more light-emissive layers formed there-between;
   b) forming a patterned protective layer on the transparent electrode, the patterned protective layer having open areas wherein the protective layer is not present and covered areas wherein the protective layer is present;
   c) providing a solution comprising curable conductive precursor components;
   d) depositing the solution over the open areas onto the transparent electrode;
   e) pattern-wise curing the precursor components of the solution to form patterned electrically conductive areas on the transparent electrode in the open areas; and
   f) removing the uncured precursor components of the solution.

2. The method of claim 1, wherein the protective layer is patterned by exposure to a patterned beam of radiation that locally ablates or melts the protective layer in the open areas.

3. The method of claim 1, further comprising the step of forming light or heat absorbing areas over the substrate in the open areas and wherein the protective layer is patterned by exposure to radiation that locally ablates or melts the protective layer in the open areas.

4. The method of claim 3, wherein the radiation is not patterned.

5. The method of claim 1, wherein the precursor components are cured by exposure to radiation.

6. The method of claim 5, wherein the radiation is patterned.

7. The method of claim 1, wherein the solution is deposited using hopper, slide, inkjet, or spray deposition.

8. The method of claim 1, wherein the solution is pattern-wise deposited over the open areas.

9. The method of claim 1, wherein the solution is pattern-wise deposited over the open areas and environs.

10. The method of claim 1, wherein the curing includes a global drying step followed by a patterned heating step.

11. The method of claim 1, wherein the precursor components are silver nano-particles and the curing sinters the nano-particles to form an electrically conductive area or a UV-curable conductive ink.

12. An LED device having improved power distribution comprises:
   a) an LED formed over a substrate, the LED including a first electrode, a transparent electrode, and one or more light-emissive layers formed there-between;
   b) a patterned protective layer formed on the transparent electrode, the patterned protection layer having open areas wherein the protective layer is not present and covered areas wherein the protective layer is present; and
   c) a solution, including electrically conductive curable components, deposited in the open areas.

13. The LED device of claim 12, wherein the electrically conductive curable components are silver nano-particles sintered to form an electrically conductive area or a UV-curable conductive ink.

14. The LED device of claim 12, wherein the protective layer is organic.

15. The LED device of claim 14, wherein the protective layer is a polymer.

16. The LED device of claim 15, wherein the protective layer is parylene.

17. The LED device of claim 12, wherein the protective layer is inorganic.

18. The LED device of claim 17, wherein the protective layer is a metal oxide.

19. The LED device of claim 12, wherein the light-emissive layers comprise inorganic materials that include core/shell quantum dots in a polycrystalline semiconductor matrix.

20. The LED device of claim 12, wherein the light-emissive layers comprise organic materials.

* * * * *